(12) United States Patent
Choi et al.

(10) Patent No.: US 6,787,810 B2
(45) Date of Patent: Sep. 7, 2004

(54) IMAGE INPUT/OUTPUT DEVICE FOR DISPLAYING AN IMAGE ON A SINGLE PANEL

(75) Inventors: Byoung-lyong Choi, Seoul (KR); Eun-kyung Lee, Suwon (KR); Jun-young Kim, Gunpo (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/367,786

(22) Filed: Feb. 19, 2003

(65) Prior Publication Data
US 2003/0168668 A1 Sep. 11, 2003

(30) Foreign Application Priority Data
Mar. 11, 2002 (KR) .................. 10-2002-0012979

(51) Int. Cl.[7] .................................... H01L 31/072
(52) U.S. Cl. ...................... 257/82; 257/13; 257/80
(58) Field of Search ..................... 257/13, 80, 82

(56) References Cited
U.S. PATENT DOCUMENTS 3,560,756 A * 2/1971 Labuda ...................... 313/392
5,569,938 A * 10/1996 Shoda et al. .................. 257/82
5,600,157 A * 2/1997 Abiko et al. .................. 257/84
6,518,085 B1 * 2/2003 Wang et al. .................. 438/70

* cited by examiner

Primary Examiner—Allan R. Wilson
(74) Attorney, Agent, or Firm—Sughrue Mion, PLLC

(57) ABSTRACT

Provided is an image input/output device including a silicon light device panel consisting of a plurality of silicon light devices arranged on an n- or p-type silicon based substrate in two or more-dimensional arrays for inputting and/or outputting an image. The silicon light device includes a silicon light device panel consisting of a plurality of silicon light devices arranged on an n- or p-type silicon based substrate in two or more-dimensional arrays for inputting and/or outputting an image. Each of the plurality of silicon light devices includes a doping region on one surface of the substrate, so that the silicon light device is used as a light-emitting device and light-receiving device, the doping region being doped to an ultra-shallow depth with a predetermined dopant of the opposite type to the substrate.

24 Claims, 8 Drawing Sheets

Longitudinal QW      Lateral QW

IMAGE INPUT/OUTPUT DEVICE FOR DISPLAYING AN IMAGE ON A SINGLE PANEL

BACKGROUND OF THE INVENTION

This application claims the priority of Korean Patent Application No. 2002-12979, filed on Mar. 11, 2002, in the Korean Intellectual Property Office, which is incorporated herein in its entirety by reference.

1. Field of the Invention

The present invention relates to an image input/output device, and more particularly, to an image input/output device for displaying an image on a single panel and generating an electrical image signal by photographing an object or inputting optical information.

2. Description of the Related Art

As communications over the Internet and the use of mobile phones expand constantly, there is an increasing demand for photographing desired objects and transmitting images thereof to other parties as well as displaying images sent from other parties on a monitor.

To meet this increasing demand, it has become quite popular to install a separate camera in a computer system besides a monitor 1 for displaying an image as shown in FIG. 1, which allows an operator to photograph a desired object and transmit the image thereof to other parties. In FIG. 1, reference numerals 3 and 4 denote a main frame of a computer and a keyboard for inputting data, respectively.

Since a conventional display device like a typical computer monitor can simply display an image, a separate camera is required in order to photograph an object and visually communicate with the other party.

However, in order to take a photograph of himself/herself without preventing a user to view an image displayed on a display device, the operator has to position a camera away from the display device. This has a problem in that it is impossible to photograph the operator right in front of the display device, which reduces the vividness in interactive visual communications.

In addition, for digital television using a conventional display device, it is difficult for the viewer to directly select commands from a menu displayed on the screen with an optical remote controller, etc., since such a display device just serves as a display screen.

SUMMARY OF THE INVENTION

To solve the above problems, the present invention provides an image input/output device that allows an operator to photograph himself/herself in front of a display and generate an electrical image signal, or to directly input optical information on a screen.

According to one aspect of the present invention, there is provided an image input/output device including a silicon light device panel consisting of a plurality of silicon light devices arranged on an n- or p-type silicon based substrate in two or more-dimensional arrays for inputting and/or outputting an image. Each of the plurality of silicon light devices includes a doping region on one surface of the substrate, so that the silicon light device is used as a light-emitting device and light-receiving device, the doping region being doped to an ultra-shallow depth with a predetermined dopant of the opposite type to the substrate. An electrode is patterned into the substrate to enable the input and/or output of the image into and from the silicon light device panel on a pixel-by-pixel basis.

Here, an input and output of the image are performed with respect to different pixels. Alternatively, input and output of the image may be performed with respect to the same pixel.

The silicon light device further includes a control layer acting as a mask so that the doped region can be formed to an ultra-shallow depth.

The silicon light device panel may be configured so that three or more silicon light devices, which emit and/or absorb light, correspond to each pixel. Preferably, the three or more silicon light devices corresponding to each pixel are designed to input and/or output different wavelengths of light for representing a color image.

The image input/output device may further comprise a color filter for displaying a clear color image on a light input and/or output side of the silicon light device panel.

Also, the image input/output device according to the present invention can be used in a digital television for which an optical remote controller is used to input information on a screen and/or select a menu command on the screen.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Figure 1:
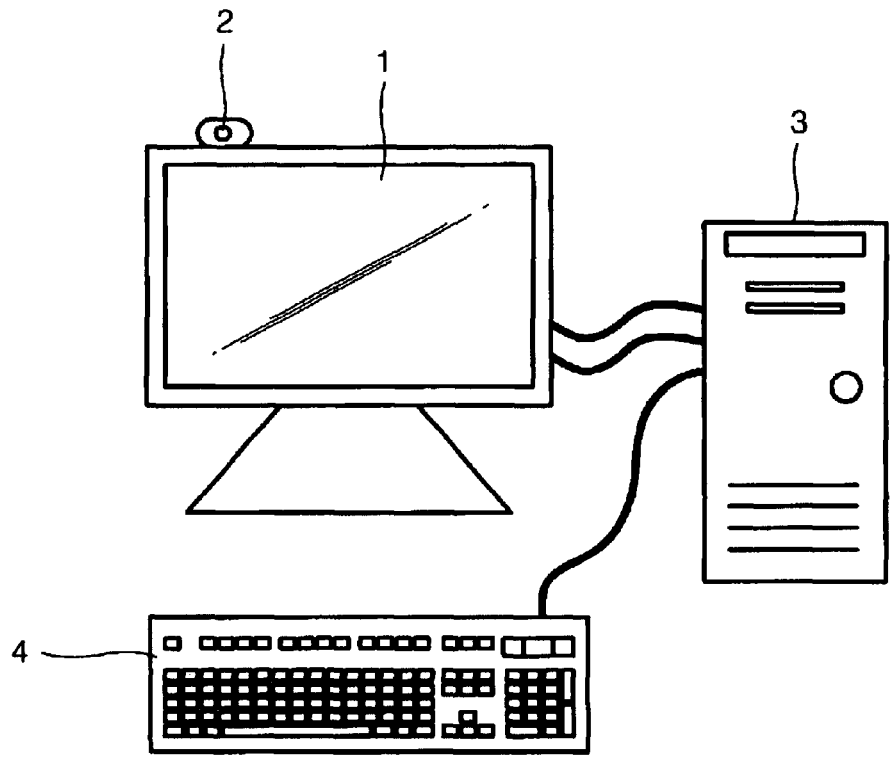
FIG. 1 schematically shows a typical computer system.
Figure 2:
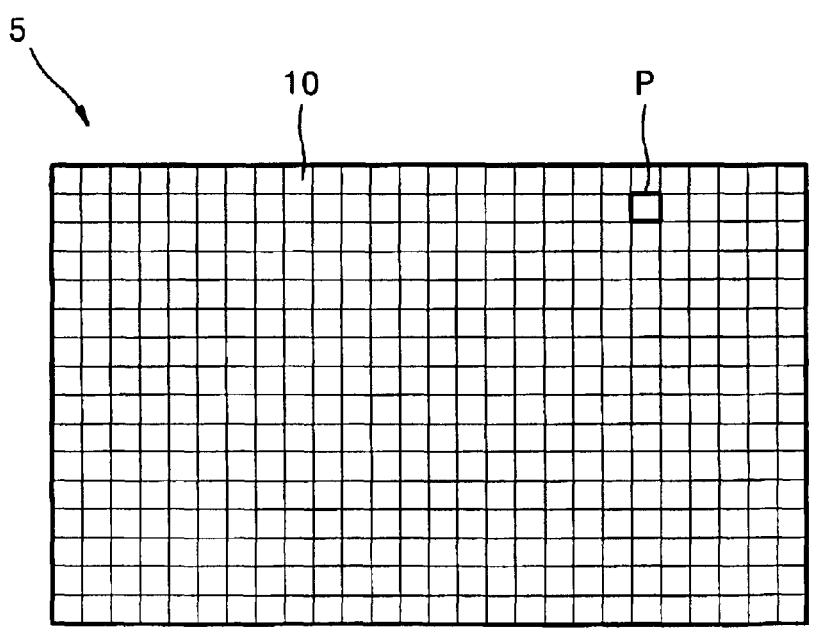
FIG. 2 is a top view schematically showing an image input/output device according to a first preferred embodiment of the present invention.
Figure 3:
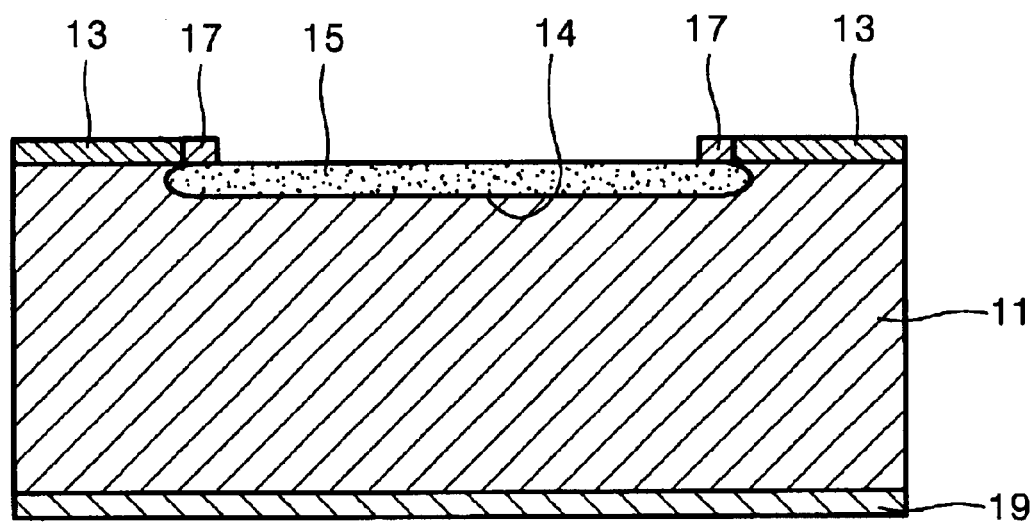
FIG. 3 is a schematic cross-section of the structure of a silicon light device used as a light-emitting and/or light-receiving device in an image input/output device according to the present invention.

Referring to FIGS. 2 and 3, an image input/output device according to a first embodiment of the present invention includes a silicon light device panel 5 composed of a plurality of silicon light devices 10 arranged in two-dimensional arrays for inputting and/or outputting an image on a single silicon-based substrate of n-type or p-type. In this disclosure, 'outputting an image' and 'inputting an image' must be understood to have the same meanings as 'displaying an image' and 'generating an electrical image signal by photographing an object with a camera', respectively.

The silicon light device 10, which includes a ultra-shallowly doped region 15 of the opposite type to a substrate 11 and formed on one surface of the substrate 11, may be used as a light-emitting or light-receiving device in which an electron-hole pair creation and annihilation combination occur at a p-n junction 14 of the doped region 15 due to a quantum confinement effect.

Thus, it is possible to fabricate the silicon light device panel 5 that enables an image to be input and/or output by forming the two-dimensional arrays of the silicon light device 10 on the single substrate 11 through a series of semiconductor manufacturing process steps.

Referring to FIG. 3, the silicon light device 10 includes the doped region 15 formed on the one surface of the n-type doped silicon-based substrate 11, for example, and first and second electrodes 17 and 19 formed in the substrate 11 so that they can be electrically connected to the doped region 15. Preferably, the silicon light device 10 further includes a control layer 13 serving as a mask, so that the doped region 15 can be formed to an ultra-shallow depth on one surface of the substrate 11. The control layer 13 can be selectively removed from the substrate 11 after the doped region 15 has been formed.

The substrate 11 may be an n-type or p-type doped silicon-based semiconductor substrate composed of a predetermined semiconductor material containing silicon (Si) such as Si, silicon carbide (SiC), or diamond.

The doped region 15 has an opposite doping type to the substrate 11 such as p+-type and is formed by injecting a predetermined dopant such as boron or phosphorous into the substrate 11 via an opening of the control layer 13 by non-equilibrium diffusion.

During the doping of the doping region 15, at least one of the quantum wells, quantum dots, and quantum wires is formed at an interface between the doping region 15 and the substrate 11, i.e., the p-n junction 14. It is preferable that the doping region 15 is formed to an ultra-shallow depth so that photoelectric transformation, i.e., an electron-hole pair creation and annihilation combination, can occur due to higher quantum efficiency, and due to a quantum confinement effect.

Here, quantum wells are mostly formed across the p-n junction 14. Alternatively, quantum dots or quantum wires may be formed across the p-n junction 14. A multiple structure consisting of at least two of quantum wells, quantum dots, and quantum wires may be formed at the p-n junction 14. Hereinafter, when quantum wells are formed across the p-n junction 14, it must be understood that at least one of the quantum wells, quantum dots, and quantum wires are formed there.

Figure 4A:
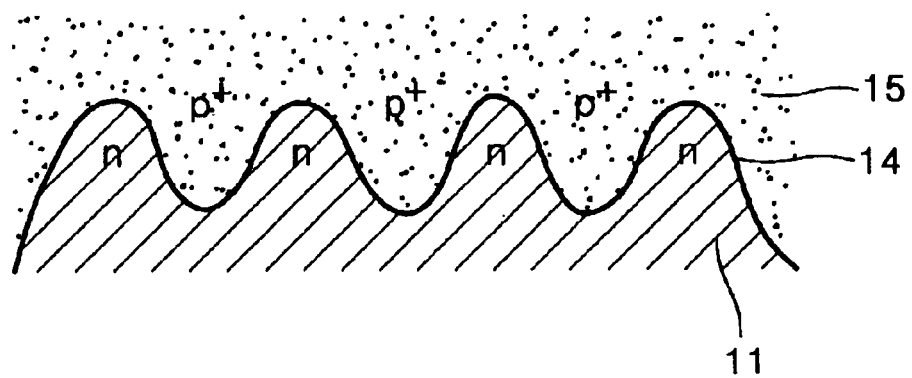
FIG. 4A schematically shows the structure of a p-n junction when a doped region of an ultra-shallow depth is formed by means of non-equilibrium diffusion.
Figure 4B:
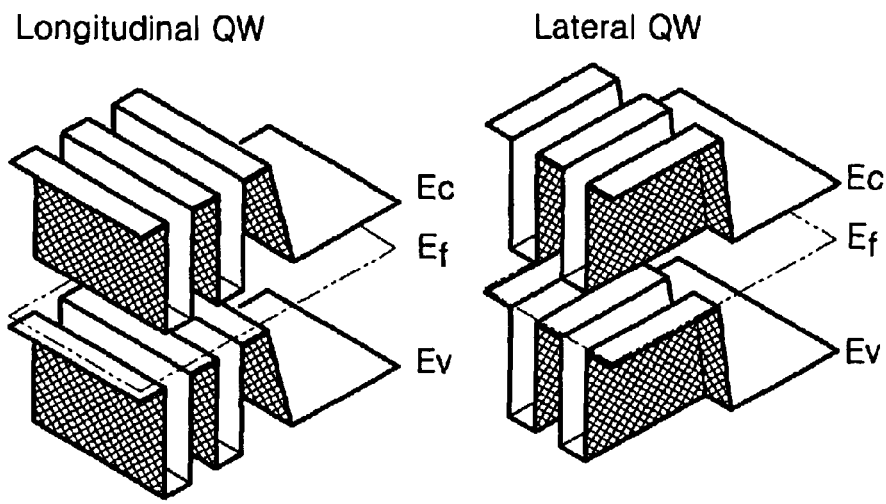
FIG. 4B shows energy-bands in quantum wells formed in the longitudinal and lateral directions of a surface across the p-n junction of FIG. 4A by non-equilibrium diffusion.

FIG. 4A shows the structure of the p-n junction 14 when forming the ultra-shallow doped region 15 by non-equilibrium diffusion. FIG. 4B shows energy-bands in quantum wells formed across the p-n junction 14 of FIG. 4A in longitudinal and lateral directions with respect to the surface of the junction. In FIG. 4B, $E_c$, $E_v$, and $E_f$ denote conduction-band, valence band, and Fermi energy levels, respectively. Since the energy levels are well known in the field of semiconductor technology, a detailed description thereof will be omitted.

As shown in FIGS. 4A and 4B, the p-n junction 14 has a quantum well structure in which different doped regions are alternately formed. Here, the well and barrier have depths of about 2 and 3 nm, respectively.

The thickness of the control layer 13 and diffusion process conditions are optimally controlled to form quantum wells to an ultra-shallow depth in the p-n junction 14.

The thickness of a diffusion profile may be adjusted to 10–20 nm, for example, by appropriate diffusion temperature and deformed potential along the surface of the substrate 11 during the diffusion process. A quantum well system is created by the ultra-shallow diffusion profile thus formed. Here, the potential along the surface of the substrate 11 changes depending on the initial thickness of the control layer 13 and surface pre-treatment. The potential undergoes severe changes as the process takes place.

Preferably, the control layer 13 is a silicon oxide ($SiO_2$) layer having a thickness appropriate to form the doped region 15 to an ultra-shallow depth. The control layer 13 may be formed in a mask structure by forming a silicon oxide layer on one surface of the substrate 11 and etching an opening for performing diffusion by means of a photolithography process.

As is known in the field of diffusion techniques, if the thickness of the silicon oxide layer is larger than an appropriate thickness (e.g. several thousand Angstroms) or the diffusion temperature is low, vacancy mainly affects diffusion so that the diffusion deeply occurs. If the thickness of the silicon oxide layer is smaller than the appropriate thickness or the diffusion temperature is high, Si self-interstitial strongly affects diffusion so that the diffusion deeply occurs. Thus, if a silicon oxide layer is formed to an appropriate thickness so that Si self-interstitial and vacancy are generated to have the almost the same ratio, Si self-interstitial and vacancy are combined to retard dopant diffusion, thereby enabling ultra-shallow doping. Here, since the physical properties of the vacancy and self-interstitial are well known in the field of diffusion technology, a detailed description thereof will be omitted.

Here, if the substrate 11 is p-type doped, the doped region 15 is n+-type doped.

When the first electrode 17 is formed on one surface of the substrate 11 where the doped region 15 has been formed, the second electrode 19 may be formed on the other surface of the substrate 11. FIG. 3 shows an example in which the first electrode 17 made of opaque metal is formed to contact the margins of the doped region 15. The first electrode 17 may be formed of transparent electrode material such as indium tin oxide over the doped region 15.

Here, the first and second electrodes 17 and 19 are patterned into the substrate 11, which forms the basis of the silicon light device panel 5, so that an image input and/or output is performed for each pixel by the silicon light device panel 5 according to the present invention, as shown in FIG. 2, in order to two-dimensionally display the image and/or photograph an object and convert it into an electrical image signal.

The silicon light device 10 may be used as a light-emitting and light-receiving device as described above since quantum wells in which electron-hole pair creation and annihilation occur are formed at the p-n junction 14 between the doped region 15 and the substrate 11.

The silicon light device 10 may act as a light-emitting device. For example, if power (voltage or current) is applied through the first and second electrodes 17 and 19, carriers, which are both electrons and holes, are then injected into a quantum well of the p-n junction 14 and recombined (annihilated) through subband energy level in the quantum well. In this case, electro luminescence (EL) occurs at various wavelengths according to the state in which carriers are recombined, and the quantity of light emitted varies depending on the amount of power (voltage or current) applied through the first and second electrodes 17 and 19.

The silicon light device 10 may be used as a light-receiving device as well. That is, when a photon of incident light is absorbed into the p-n junction having the quantum well structure, electrons and holes are excited into subband energy levels in a quantum well 31 formed across the p-n junction 14. Thus, when the silicon light device 10 is connected to an external circuit such as a load resistor 18, current is output proportional to the amount of irradiated light.

Thus, using the silicon light device panel 5 consisting of a plurality of silicon light device arranged in two-dimensional arrays allows for two-dimensional input and/or output of the image.

In this case, absorption or emission wavelength at the silicon light device 10 is determined by micro-cavities due to micro-defects formed on the surface of the substrate 11 (actually on the surface of the doped region 14). Thus, the silicon light device 10 with the desired range of absorption and emission wavelengths can be obtained by adjusting the size of micro-cavity during the manufacturing process.

Here, the intensity and absorption ratio of electroluminescence (EL) can be amplified and increased when the wavelengths of electro luminescence matches well with the resonance wavelength of micro-cavities. Therefore, by adjusting the size of micro-cavity during the manufacturing process, a light-emitting and light-receiving device is capable of emitting and absorbing light ranging from the very short wavelengths to a long wavelength (in particular, ranging from ultra violet (UV) to far infra red (IR)), are obtained respectively. That is, if micro-cavities have a uniform size, the silicon light device 10 emits and absorbs light at a particular wavelength. On the other hand, if they have various sizes, the silicon light device 10 emits and absorbs at various wavelengths. Thus, the silicon light device 10 can emit and absorb white light.

Here, a micro-cavity is caused by deformed potential due to micro-defects formed on the surface of the doped region 14. Thus, the deformed potential can be adjusted to deform quantum wells, which determines the size of micro-cavity. By adjusting the size of a micro-cavity, light with a specific wavelength or a broad range of wavelengths can be emitted or absorbed.

As described above, the silicon light device 10 has high quantum efficiency since a quantum confinement effect occurs due to local variations in charge distribution potential along the p-n junction 14 of the ultra-shallow doped region 15 and a subband energy level is formed in the quantum wells.

Here, a silicon light device 10 acting as a light-emitting or light-receiving device has been described in detail in Korean Patent Application Nos. 2002-1431 entitled "Silicon light device and Light-emitting Device Using the Same" and 2002-7707 entitled "Silicon Light-receiving Device" filed by the applicant of the present invention. The Korean Patent Application Nos. 2002-1431 and 2002-7707 correspond to U.S. Ser. No. 10/122,421 and PCT/KR02/01932, respectively. These applications are incorporated by reference herein and a detailed explanation of the silicon light device 10 will be omitted.

Referring to FIG. 2, electrodes in the silicon light device panel 5 consisting of two-dimensional arrays of photo diodes 10, as described above, are patterned into the substrate 11 based on silicon in order to enable the input and/or output of the image on a pixel-by-pixel basis.

In an image input/output device according to the present invention, the silicon light device panel 5, as shown in FIG. 2, may be formed so that a single silicon light device 10 corresponds to each pixel P. Preferably, each silicon light device 5 is configured to emit and/or absorb light of a single wavelength or white light.

When the silicon light device 10 is configured to emit and/or absorb light of a single wavelength or white light, the image input/output device according to the present invention makes it possible to display a monochromic image and generate an electrical monochromic image signal by photographing an object.

Figure 5:
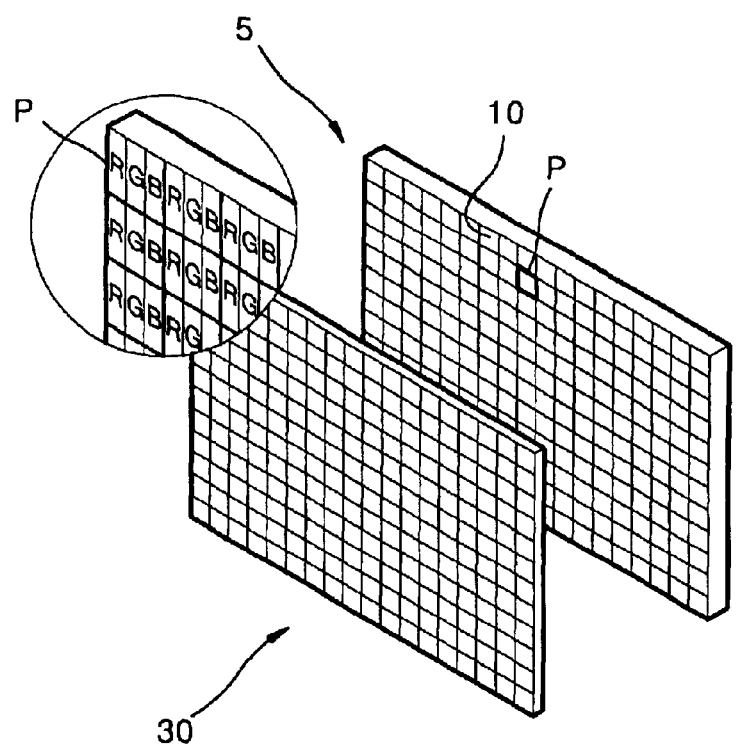
FIG. 5 is an exploded perspective view of an image input/output device according to a second preferred embodiment of the present invention.

Meanwhile, as shown in FIG. 5, when each silicon light device 10 of the silicon light device panel 5 is configured to emit and/or absorb white light and to further include a color filter 30 for displaying a full-color image over the front of the silicon light device panel (on light input and/or output side), an image input/output device according to the present invention is capable of displaying a full-color image and generating an electrical full-color image signal by taking a color photograph of an object.

Figure 6:
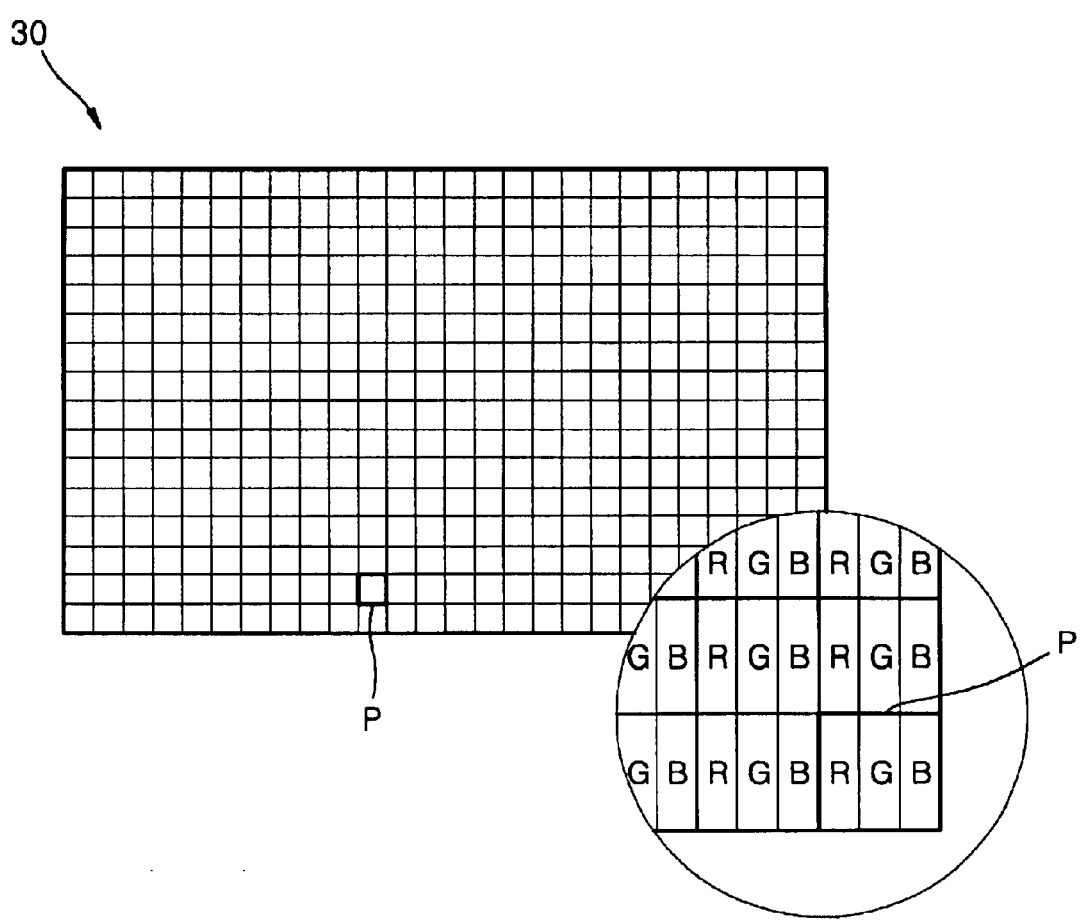
FIG. 6 is a top view schematically showing the structure of the color filter shown in FIG. 5.

In this case, the color filter 30, as shown in FIG. 6, may be configured so that all R, G, and B color components correspond to each pixel P. The R, G, and B components of the color filter 30 are two-dimensionally arranged similar to the way in which silicon light devices in a silicon light device panel according to another embodiment of the present invention, which will be described later, are arranged. Here, various changes may be made with respect to arrangement in the color filter 30 for representing R, G, and B colors.

In this way, the image input/output device including the color filter 30 located over the front of the silicon light device 5 allows a color image to be input and/or output. That is, this device makes it possible to convert the image photographed into an electrical color image signal, and also, to display a full color image according to the electrical color image signal.

Figure 7:
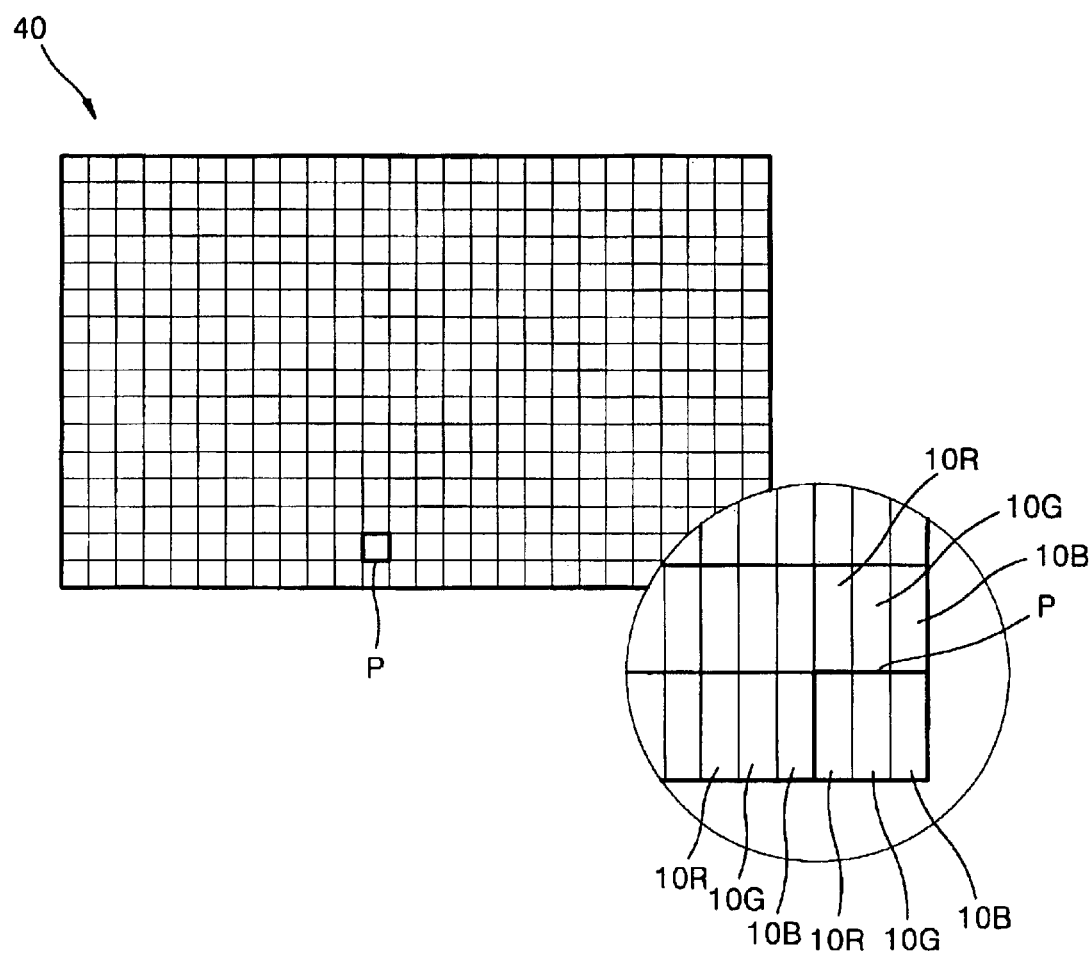
FIG. 7 schematically shows an image input/output device according to a third preferred embodiment of the present invention.

FIG. 7 schematically shows an image input/output image device according to a third embodiment of the present invention. Referring to FIG. 7, a silicon light device panel 40 is configured so that at least three silicon light devices 10R, 10G, and 10B correspond to each pixel P. FIG. 7 shows an example in which the silicon light device panel 40 is designed such that the three silicon light devices 10R, 10G, and 10B correspond to each pixel P.

In this case, the three silicon light devices 10R, 10G, and 10B corresponding to each pixel P are designed to emit a red light R, a green light G, and a blue light B and/or absorb the red light R, the green light G, and a blue light B, and convert them into electrical color image signals. Since the structure and composition of materials of the three silicon light devices 10R, 10G, and 10B are substantially the same as those of the silicon light device 10 described earlier with reference to FIGS. 3, 4A, and 4B except for the difference in wavelengths, a detailed description thereof will be omitted.

According to one aspect of the present invention, using the silicon light device panel 40 shown in FIG. 7 makes it possible to realize a color image without a separate color filter. Here, the color filter 30 shown in FIG. 6 may be positioned over the front of the silicon light device panel 40 in order to produce a clearer color image. Furthermore, various changes may be made with respect to the color arrangement in said at least three silicon light devices 10R, 10G, and 10B for emitting and/or absorbing three wavelengths of light corresponding to each pixel.

Various changes may be made to the image input/output device, according to the present invention, which is capable of inputting and/outputting the monochromic image or color image described above. Such changes may be made due to changes in the configuration of a circuit for controlling the input and/or output of the image.

Figure 8:
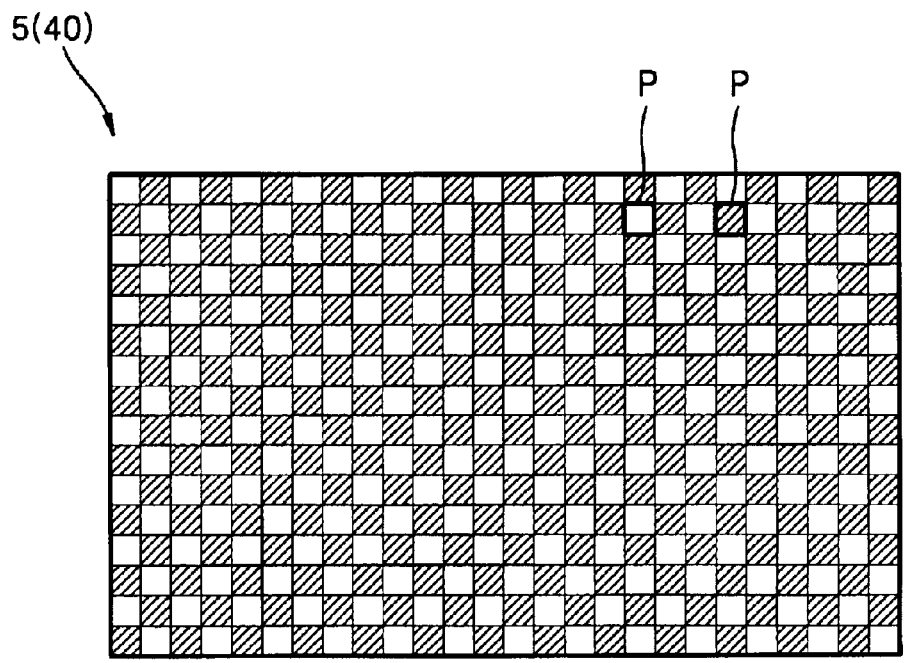
FIG. 8 schematically shows the input and output of an image on an image input/output device according to a preferred embodiment of the present invention.

That is, as shown in FIG. 8, an image input/output device according to the present invention may be configured so that image input and output are performed in pixels arranged alternately. In FIG. 8, shadowed pixels are those for inputting the image in which the silicon light device described above is used as a light-receiving device, whereas unshadowed pixels are those for outputting the image in which the silicon light device is used as light-emitting device.

As shown in FIG. 8, the image input/output device according to the present invention may be configured so that image input and output are performed by different silicon light devices in the silicon light device panel 5 or 40. Here, various changes may be made to the arrangement of image input and output pixels. For example, pixels located in predetermined regions of the silicon light device panel 5 or 40 may be used for the image input while those located in the remaining regions may be used for the image output.

Furthermore, in the image input/output device according to the present invention which is configured to use different silicon light devices 10 for inputting and outputting the image as shown in FIG. 8, image input and output pixels are interchangeable since a silicon light device can be used as a light-emitting and light-receiving device, and the number of image input and output pixels may be changed. This is made possible by implementing a drive and/or a control circuit and algorithm for the image input/output device so that the image input and output pixels can be changed as required.

Figure 9A:
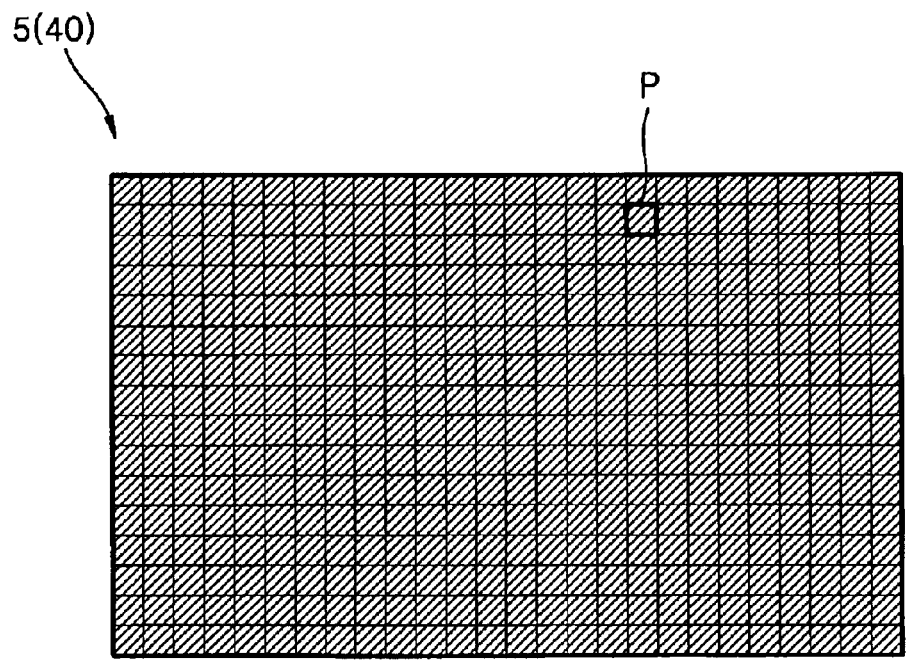
FIGS. 9A and 9B schematically show an image input/output device, according to an embodiment of the present invention, in which an image is input and output, respectively.
Figure 9B:
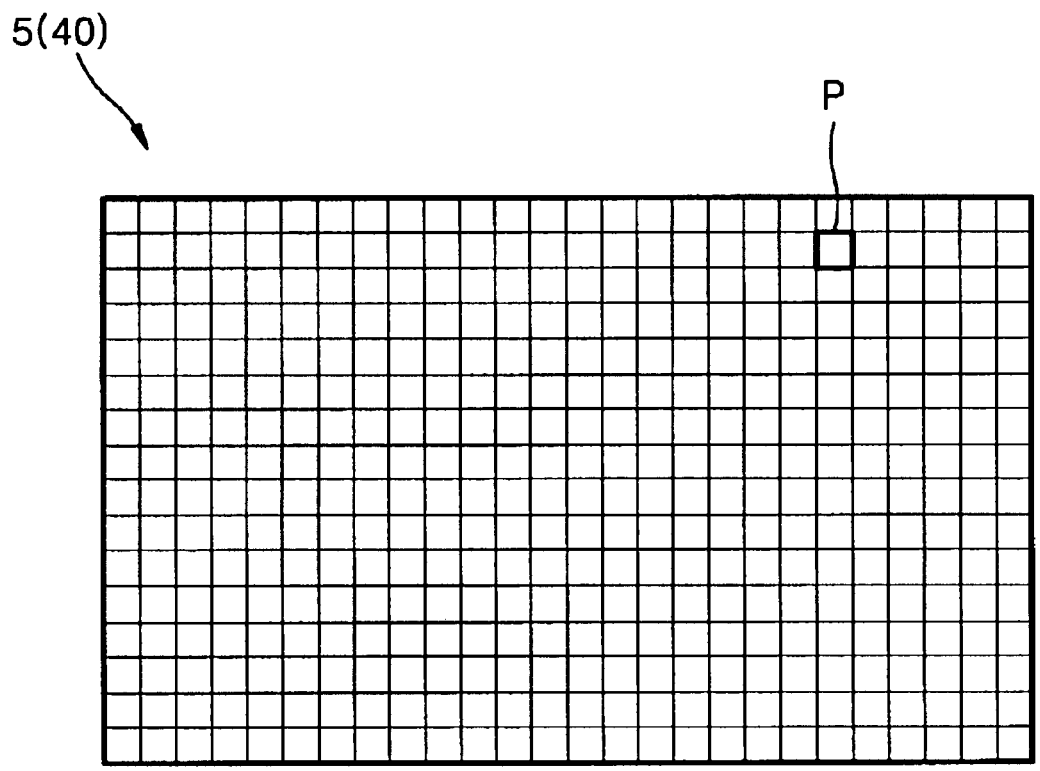

Alternatively, as shown in FIGS. 9A and 9B, an image input/output device according to the present invention may be configured so that image input and output is performed with a time difference by the same silicon light device in the silicon light device panel 5 or 40. FIG. 9A shows a state in which image input is performed in the silicon light device panel 5 or 40 of the image input/output device according to the present invention, and FIG. 9B shows a state in which image output is performed therein. Here, each pixel P of the silicon light device panel 5 or 40 shown in FIGS. 8, 9A, and 9B may have a structure in which each pixel P corresponds to a single silicon light device 10 (as in the first and second embodiments described with reference to FIGS. 2 and 5) or to at least three silicon light devices 10R, 10G, and 10B (as in the third embodiment described with reference to FIG. 7).

Since an image input/output device according to the present invention as described above is capable of directly inputting optical information on the screen, the image input/output device can be used as an image input/output device for computer monitors, televisions, digital televisions in particular, and equipment for visual communication and/or bi-directional information transmission such as handheld terminals. In this case, since the image input/output device according to the present invention allows image input and output in a single panel, the use of this device eliminates the need for a separate camera when performing visual communication. Here, examples of the handheld terminals may include a wide variety of portable communication equipment such as mobile phones and personal digital assistants (PDAs).

Furthermore, an image input/output device, according to the present invention capable of inputting and outputting image in a single panel, makes it possible for an operator to take a photograph of himself/herself right in front of a display device and transmit it, thus enhancing vividness in visual communications.

Although this invention has been described with reference to an image input/output device including a single silicon photo diode panel consisting of a plurality of silicon light devices arranged in two-dimensional arrays, the present invention is not limited to this. That is, an input/output device according to the present invention may be configured in combinations of a plurality of silicon light device panels to have a larger screen.

Figure 10:
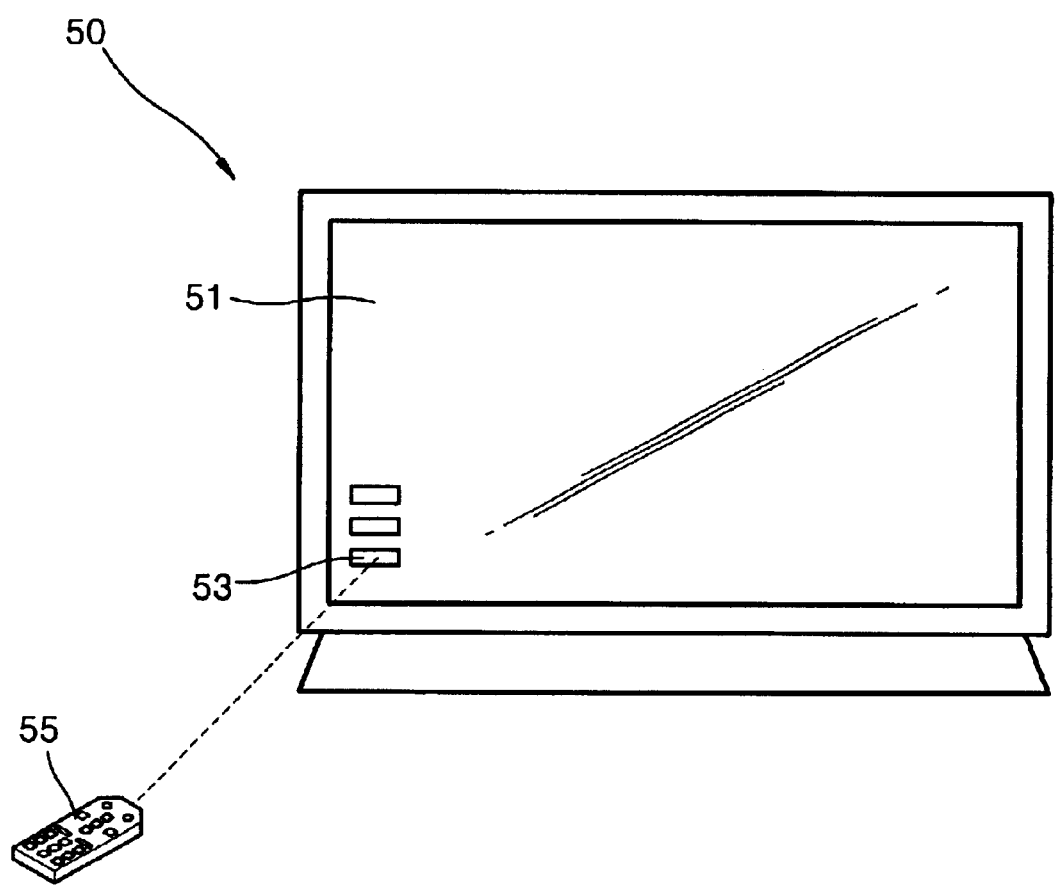
FIG. 10 shows an image input/output device used as a digital television according to an embodiment of the present invention.

FIG. 10 shows an image input/output device used as a digital television according to a preferred embodiment of the present invention. As shown in FIG. 10, the image input/output device can be used in a digital television designed to input information on a screen 51 and select menus with an optical wireless remote controller 55. The optical wireless remote controller 55 is designed to irradiate light only in a specific range like an optical pointer. When an optical information signal is irradiated onto a specific region, such as a predetermined menu 53, from the optical wireless remote controller 55, a silicon light device serving as a light-receiving device positioned in the specific region receives the optical information signal and, according to the received optical signal, for example, changes channels of the digital television 50 or allows one to work on the Internet.

In addition to the above, an image input/output device may be used in various applications for equipment requiring bi-directional information transmission.

The image input/output device according to the present invention as described above includes a silicon light device panel consisting of silicon light devices arranged in two-dimensional arrays and used as light-emitting and light-receiving devices, thus making it possible to display an image and generating an electrical image signal by photographing a desired object without prohibiting a user from viewing the image displayed on the single panel, or to directly input optical information on a screen thus allowing the bi-directional information transmission.

Thus, when using the image input/output device, according to the present invention, visual vivid communications can be obtained by eliminating the need for a separate camera. Using this device for a digital TV allows a menu on a screen to be directly selected with an optical remote controller.

While this invention has been particularly shown and described with reference to preferred embodiments thereof, it will be understood by those skilled in the art that various changes in form and details may be made therein without departing from the spirit and scope of the invention as defined by the appended claims and equivalents thereof.

What is claimed is:

1. An image input/output device comprising a silicon light device panel comprising a plurality of silicon light devices arranged on one of an n-type silicon based substrate and a p-type silicon based substrate in at least two dimensional arrays for at least one of inputting and outputting an image, wherein each of the plurality of silicon light device includes a doped region on one surface of the substrate, so that at least one of the plurality of silicon light devices is operable as a light-emitting device and as a light-receiving device, the doped region being doped to a depth with a predetermined dopant of the opposite type to the substrate such that a photoelectrical conversion effect by quantum confinement in a p-n junction between the doped region and the substrate occurs, and wherein an electrode is patterned into said one of an n-type silicon based substrate and a p-type silicon based substrate, to enable at least one of inputting and outputting of the image into and from the silicon light device panel on a pixel-by-pixel basis.

2. The device of claim 1, wherein the inputting and the outputting of the image are performed with respect to different pixels.

3. The device of claim 1, wherein the inputting and outputting of the image are performed with respect to the same pixel.

4. The device of claim 1, wherein said at least one of the plurality of silicon light devices further includes a control layer that limits the doped region to said depth.

5. The device of claim 2, wherein said at least one of the plurality of silicon light devices further includes a control layer having a thickness which limits the doped region to said depth.

6. The device of claim 3, wherein said at least one of the plurality of silicon light devices further includes a control layer having a thickness which limits the doped region to said depth.

7. The device of claim 1, wherein, in the silicon light device panel, three or more of the plurality of silicon light devices for at least one of emitting and absorbing light, correspond to each pixel.

8. The device of claim 2, wherein, in the silicon light device panel, three or more silicon light devices for at least one of emitting and absorbing light correspond to each pixel.

9. The device of claim 3, wherein, in the silicon light device panel, three or more silicon light devices for at least one of emitting and absorbing light correspond to each pixel.

10. The device of claim 7, wherein said three or more of the plurality of silicon light devices corresponding to each pixel are designed to perform at least one of inputting and outputting different wavelengths of light for representing a color image.

11. The device of claim 8, wherein said three or more of the plurality of silicon light devices corresponding to each pixel are designed to perform at least one of inputting and outputting different wavelengths of light for representing a color image.

12. The device of claim 9, wherein said three or more of the plurality of silicon light devices corresponding to each pixel are designed to perform at least one of inputting and outputting different wavelengths of light for representing a color image.

13. The device of claim 10, further comprising a color filter for displaying a clear color image on at least one of a light input side and an output side of the silicon light device panel.

14. The device of claim 11, further comprising a color filter for displaying a clear color image on at least one of a light input side and an output side of the silicon light device panel.

15. The device of claim 12, further comprising a color filter for displaying a clear color image on at least one of a light input side and an output side of the silicon light device panel.

16. The device of claim 1, wherein the device is used in a digital television for which an optical remote controller is used for at least one of inputting information on a screen and selecting a menu command on the screen.

17. The device of claim 2, wherein the device is used in a digital television for which an optical remote controller is used for at least one of inputting information on a screen and selecting a menu command on the screen.

18. The device of claim 3, wherein the device is used in a digital television for which an optical remote controller is used for at least one of inputting information on a screen and selecting a menu command on the screen.

19. The device of claim 1, wherein, in the silicon light device panel, three or more of the plurality of silicon light devices for emitting and absorbing light, correspond to each pixel.

20. The device of claim 2, wherein, in the silicon light device panel, three or more silicon light devices for emitting and absorbing light correspond to each pixel.

21. The device of claim 3, wherein, in the silicon light device panel, three or more silicon light devices for emitting and absorbing light correspond to each pixel.

22. The device of claim 7, wherein said three or more of the plurality of silicon light devices corresponding to each pixel are designed to perform inputting and outputting of different wavelengths of light for representing a color image.

23. The device of claim 8, wherein said three or more of the plurality of silicon light devices corresponding to each pixel are designed to perform inputting and outputting of different wavelengths of light for representing a color image.

24. The device of claim 9, wherein said three or more of the plurality of silicon light devices corresponding to each pixel are designed to perform inputting and outputting of different wavelengths of light for representing a color image.

* * * * *